United States Patent
Sikina et al.

(10) Patent No.: US 11,432,408 B2
(45) Date of Patent: Aug. 30, 2022

(54) ADDITIVE MANUFACTURED REACTIVE BEAMFORMER

(71) Applicant: RAYTHEON COMPANY, Waltham, MA (US)

(72) Inventors: Thomas V. Sikina, Acton, MA (US);
John P. Haven, Lowell, MA (US);
Peter J. Adams, Hudson, NH (US);
James E. Benedict, Lowell, MA (US);
Carolyn R. Reistad, North Billerica, MA (US)

(73) Assignee: RAYTHEON COMPANY, Waltham, MA (US)

( * ) Notice: Subject to any disclaimer, the term of this patent is extended or adjusted under 35 U.S.C. 154(b) by 454 days.

(21) Appl. No.: 16/414,112

(22) Filed: May 16, 2019

(65) Prior Publication Data

US 2019/0357363 A1     Nov. 21, 2019

Related U.S. Application Data

(60) Provisional application No. 62/673,431, filed on May 18, 2018.

(51) Int. Cl.
*H05K 1/02* (2006.01)
*H05K 3/40* (2006.01)
*H05K 1/09* (2006.01)
*H05K 3/22* (2006.01)
(Continued)

(52) U.S. Cl.
CPC ............. *H05K 3/40* (2013.01); *H05K 1/0284* (2013.01); *H05K 1/097* (2013.01); *H05K 3/22* (2013.01); *B33Y 10/00* (2014.12); *B33Y 80/00* (2014.12)

(58) Field of Classification Search
CPC ...... H05K 1/0284; H05K 1/097; B33Y 10/00; B33Y 80/00; H01P 3/10; H01P 3/127
See application file for complete search history.

(56) References Cited

U.S. PATENT DOCUMENTS

| 2,147,717 | A | * | 2/1939 | Schelkunoff | H01P 3/122 |
| | | | | | 333/248 |
| 4,302,734 | A | * | 11/1981 | Frosch | H01P 1/15 |
| | | | | | 333/104 |
| 10,541,461 | B2 | * | 1/2020 | Teshiba | H01Q 1/526 |

(Continued)

FOREIGN PATENT DOCUMENTS

WO    WO-0219466 A2 *  3/2002    ........... H01Q 21/064

OTHER PUBLICATIONS

International Search Report and Written Opinion in application No. PCT/US2019/032627 dated Sep. 11, 2019.
(Continued)

*Primary Examiner* — Jeffrey T Carley
(74) *Attorney, Agent, or Firm* — Lando & Anastasi, LLP

(57) ABSTRACT

A reactive beamformer includes a radiator disposed within a substrate and configured to radiate a received electromagnetic signal, a plurality of receptors disposed within the substrate, each of the plurality of receptors configured to receive a portion of the radiated electromagnetic signal, and a plurality of signal lines. Each signal line of the plurality of signal lines is coupled to a respective receptor of the plurality of receptors to convey the portion of the radiated electromagnetic signal from the respective receptor and to provide the portion of the radiated electromagnetic signal to an output.

18 Claims, 7 Drawing Sheets

(51) Int. Cl.
B33Y 10/00 (2015.01)
B33Y 80/00 (2015.01)

(56) References Cited

U.S. PATENT DOCUMENTS

| | | | | |
|---|---|---|---|---|
| 2003/0020654 | A1* | 1/2003 | Navarro | H01Q 21/0093 343/702 |
| 2006/0077102 | A1* | 4/2006 | Mohamadi | H01Q 21/0006 343/700 MS |
| 2016/0134327 | A1* | 5/2016 | Joshi | H04L 23/02 375/146 |
| 2016/0141742 | A1* | 5/2016 | Xue | H01P 5/12 333/125 |
| 2016/0172741 | A1 | 6/2016 | Panat et al. | |
| 2019/0229428 | A1* | 7/2019 | Beskov | H05K 1/0284 |

OTHER PUBLICATIONS

Rave Christian et al: "A wideband radialsubstrate integrated power divider at K-band", German Microwave Conference, IMA:I Matech E.U,(2015), pp. 84-87.

Xiaoyong Shan et al. "A Novel 8-way radial power combiner" Microwave Conference (2009), pp. 2625-2628.

Kaijun Song et al. "Ku-band multiway rectangular waveguide power divider," Microwave and Optical Technology Letters, (2010) vol. 52, No. 11, pp. 2560-2563.

* cited by examiner

ADDITIVE MANUFACTURED REACTIVE BEAMFORMER

CROSS-REFERENCE TO RELATED APPLICATIONS

This application claims the benefit under 35 U.S.C. § 119(e) of U.S. Provisional Patent Application No. 62/673,431 titled ADDITIVE MANUFACTURED REACTIVE BEAMFORMER filed on May 18, 2018, which is herein incorporated by reference in its entirety for all purposes.

GOVERNMENT RIGHTS

Not applicable.

BACKGROUND

Radio frequency (RF) and electromagnetic circuits may be manufactured using conventional printed circuit board (PCB) processes. Some RF and electromagnetic circuits may include power dividers (power splitters) and combiners, for example to distribute a signal to many elements, such as radiator elements of an antenna array for beam forming, and/or to combine multiple signals from the elements into one signal. Conventional PCB manufacturing processes may include lamination, electroplating, masking, etching, and others, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as signal trace dimensions, thereby limiting the range of highest frequency signals that may be supported by such devices.

SUMMARY OF THE DISCLOSURE

One aspect of the present disclosure is directed to a reactive beamformer comprising a radiator disposed within a substrate and configured to radiate a received electromagnetic signal, a plurality of receptors disposed within the substrate, each of the plurality of receptors configured to receive a portion of the radiated electromagnetic signal, and a plurality of signal lines. Each signal line of the plurality of signal lines is coupled to a respective receptor of the plurality of receptors to convey the portion of the radiated electromagnetic signal from the respective receptor and to provide the portion of the radiated electromagnetic signal to an output.

Embodiments of the reactive beamformer further may include forming each receptor of the plurality of receptors of an electrically conducting wire deposited into a milled hole in the substrate. The radiator may be formed of an electrically conducting wire deposited into a milled hole in the substrate. Each signal line of the plurality of signal lines may be coupled to one receptor of the plurality of receptors by a solder joint formed at least in part by a solder reflow process. The plurality of receptors may be physically arranged circumferentially around the radiator, with each receptor of the plurality of receptors being substantially equidistant from the radiator and substantially equally spaced from each other. The reactive beamformer further may comprise an electrically and physically contiguous conductive wall disposed in the substrate around a perimeter of the plurality of receptors and configured to contain the radiated electromagnetic signal to a region within the conductive wall, the radiator and the plurality of receptors being disposed within the region. The reactive beamformer further may comprise a plurality of electrically conductive isolation walls disposed within the substrate and configured to isolate each receptor of the plurality of receptors from adjacent receptors of the plurality of receptors. Each of the plurality of electrically conductive isolation walls may be formed of a conductive ink deposited into a trench in the substrate. The reactive beamformer further may comprise an electrically and physically contiguous conductive outer wall disposed around a perimeter of the plurality of receptors, the conductive outer wall being electrically coupled to each isolation wall of the plurality of electrically conductive isolation walls. The reactive beamformer further may comprise a ground plane adjacent at least one surface of the substrate, with the conductive outer wall and the conductive isolation walls being in electrically conductive communication with the ground plane. The substrate may be a first substrate and the plurality of signal traces may be adjacent to a surface of a second substrate, with the second substrate being bonded to the first substrate. The second substrate may be indirectly bonded to the first substrate by one or more intermediate layers between the second substrate and the first substrate. The reactive beamformer may be configured to operate in millimeter-wave frequencies including 26.5 to 110 GHz.

Another aspect of the present disclosure is directed to a method of manufacturing a reactive beamformer. In one embodiment, the method comprises: milling a first substrate to form a first opening to accommodate a first electrical conductor; milling the first substrate to form a plurality of second openings to accommodate a plurality of second electrical conductors; milling the first substrate to form a continuous trench to accommodate a third electrical conductor; depositing a first wire as the first electrical conductor in the first opening, the first wire forming an electromagnetic radiator; depositing a plurality of second wires as the plurality of second electrical conductors in the plurality of second openings, each second wire of the plurality of second wires forming an electromagnetic receptor; and filling the continuous trench with a conductive ink, the conductive ink forming a continuous electromagnetic boundary.

Embodiments of the method further may include milling a conductive material disposed upon a second substrate to form a plurality of signal traces, with each signal trace of the plurality of signal traces having a terminal end configured to have physical and electrical alignment with a respective one of the first electrical conductor or one of the plurality of second electrical conductors when the second substrate is aligned adjacent to the first substrate. The method further may comprise bonding the second substrate to the first substrate, directly or indirectly, with the second substrate being positioned so each terminal end of the plurality of terminal ends make physical and electrical contact with one of the first electrical conductor or one of the plurality of second electrical conductors. The method further may comprise reflowing solder to bond each terminal end of the plurality of terminal ends with the respective one of the first electrical conductor or one of the plurality of second electrical conductors. The method further may comprise bonding a third substrate to the second substrate to substantially encapsulate the plurality of signal traces and terminal ends between the second substrate and the third substrate. The method further may comprise drilling through at least one of the second substrate and the third substrate to provide a plurality of access holes, with each access hole of the plurality of access holes providing access to one of the plurality of terminal ends.

Yet another aspect of the present disclosure is directed to a method of forming an electromagnetic circuit. In one embodiment, the method comprises: milling away electrically conductive material disposed upon a surface of a substrate to form one or more circuit features; milling one or more holes in the substrate; filling the one or more holes with an electrical conductor; milling one or more trenches in the substrate; filling the one or more trenches with an electrical conductor; applying solder to one or more of the circuit features or electrical conductors; bonding a portion of the substrate, directly or indirectly, to another substrate; and reflowing the solder.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION

Figure 1:
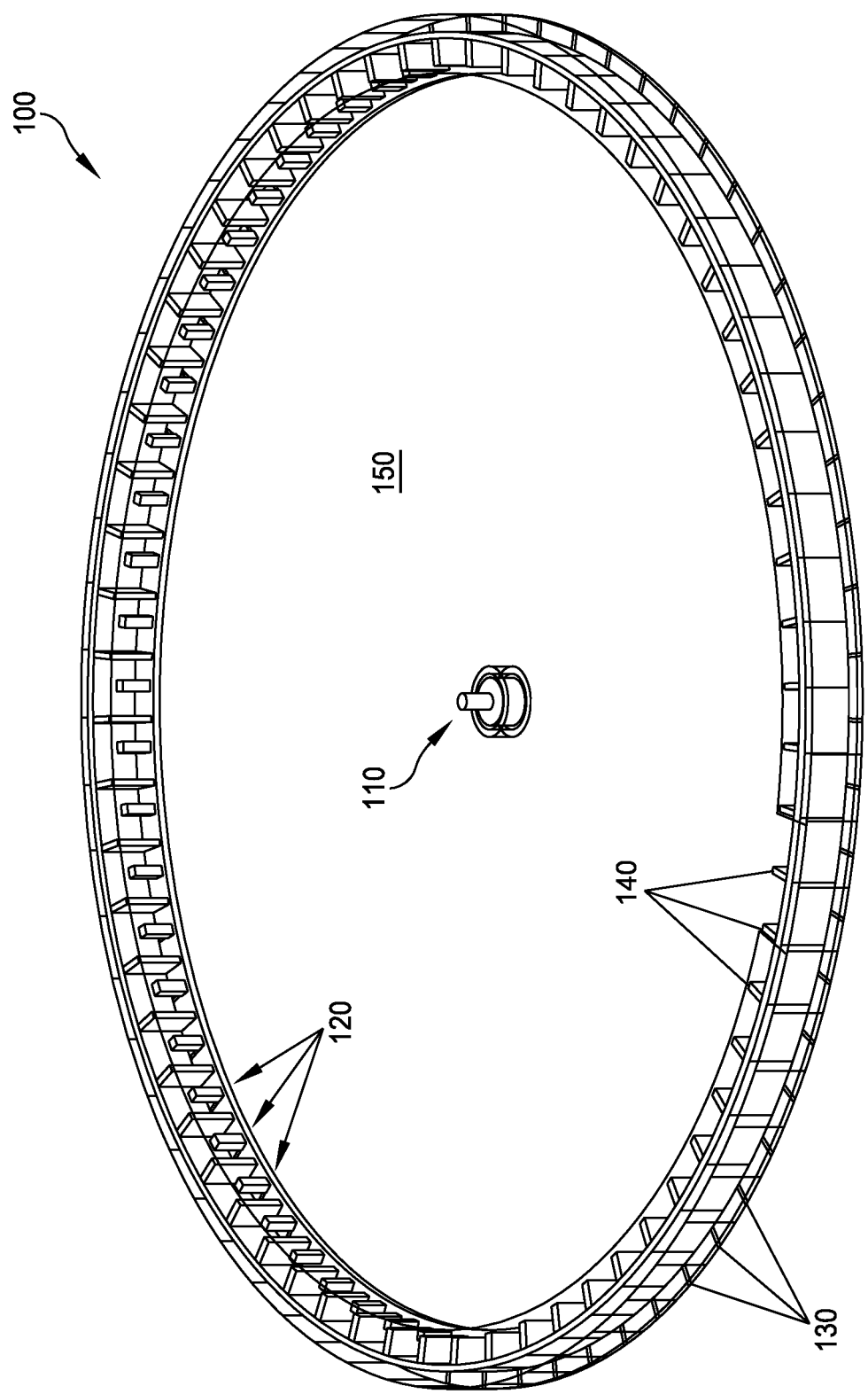
FIG. 1 is a schematic diagram of an example of a reactive beamformer.

Various aspects and embodiments are directed to compact, low profile reactive beamforming systems and methods (signal splitting/combining) for electromagnetic circuits, and improved methods of manufacture of the same, that allow for small sizes and higher frequencies than conventional systems and methods.

Aspects and examples described provide electromagnetic dividers and methods, suitable for beamforming application(s), that advantageously apply additive and subtractive manufacturing techniques to provide low profile conveyance of a single signal into many signals, and/or to provide combination of many signals into a single signal. The aspects and examples described include electromagnetic circuit structures that provide reactive distribution of a central feed signal to multiple receptors, or conversely a reactive combination of signals from the multiple receptors into a central feed, and methods of manufacturing the same. Reactive distribution and/or reactive combination of signals, as enabled by the aspects and examples herein, may be suitable for application as a beamformer, e.g., for the distribution and/or combination of signals to/from a number of elements of an, e.g., antenna array. Manufacturing processes described herein may be particularly suitable for fabrication of such circuit structures having small circuit features capable of supporting electromagnetic signals in the range of 8 to 75 GHz or more, potentially up to 300 GHz or more using suitable subtractive (e.g., milling, drilling) and additive (e.g., 3-D printing, filling) manufacturing equipment. Electromagnetic circuit structures in accord with systems and methods described herein may be particularly suitable for application in 28 to 70 GHz systems, including millimeter wave communications, sensing, ranging, etc. Aspects and embodiments described may also be suitable for lower frequency applications, such as in the S-band (2-4 GHz), X-band (8-12 GHz), or others. In some embodiments, the reactive beamformer is particularly suited to millimeter-wave frequencies, where limited 3-D real estate is a critical issue. These frequencies would include Ka-Band (26.5 to 40 GHz), V-Band (40-75 GHz) and W-Band (75-110 GHz) phased array systems.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, systems and methods in accord with those described herein may be suitable for handling non-ionizing radiation at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein. As mentioned above, the reactive beamformer of embodiments of the present disclosure is particularly suited to millimeter-wave frequencies.

The methods and apparatuses described herein may support smaller arrangements and dimensions than conventional processes are capable. Such conventional circuit boards may be limited to frequencies below about 30 GHz. The methods and apparatuses described herein may allow or accommodate the manufacture of electromagnetic circuits of smaller dimensions, suitable for radio frequency circuits intended to be operated at higher frequencies, using safer and less complex manufacturing, and at lower cost.

Electromagnetic circuits and methods of manufacture in accord with those described herein include various additive manufacturing techniques to produce electromagnetic circuits and components capable of handling higher frequencies, with lower profiles, and at reduced costs, cycle times, and design risks, than conventional circuits and methods. Examples of techniques include milling of conductive material from a surface of a substrate to form signal traces or apertures of significantly smaller dimensions than allowed by conventional PCB processes, milling of one or more substrates to form a trench, using 3-dimensional printing techniques to deposit printed conductive inks into the trench to form a Faraday wall (a continuous electric barrier, as opposed to a series of ground vias with minimum spacing therebetween), "vertical launch" signal paths formed by milling (drilling) a hole through a portion of substrate and in which a wire is placed (and/or conductive ink is printed), to make electrical contact to a signal trace disposed on a surface of the substrate (or an opposing substrate), which may include forming a Faraday wall around the vertical launch conducting wire (which may be copper in some embodiments), and using 3-dimensional printing techniques to deposit printed resistive inks to form resistive components. Any of the above example techniques and/or others (e.g., soldering and/or solder reflow), may be combined to make various electromagnetic components. Aspects and examples of such techniques are described and illustrated herein with respect to a radio frequency interconnect to convey an electromagnetic signal to or from a layer of an electromagnetic circuit, but the techniques described may be used to form various electromagnetic components, connectors, circuits, assemblies, and systems.

FIG. 1 illustrates an example of an electromagnetic circuit structure 100 that includes a central radiator 110 and a number of receptors 120. Each of the receptors 120 is coupled to an individual output signal trace 130. An arrangement of electrically conducting walls 140 form electrical barriers among and between the receptors 120, provide isolation between adjacent receptors 120, and may be termed "Faraday walls" herein because they create and enforce electromagnetic boundary conditions to contain electromagnetic energy and isolate various components (e.g., the receptors 120) from adjacent signals. In the example of FIG. 1, there are sixty-four (64) receptors 120, but various embodiments may have any number of receptors 120 to accommodate varying design criteria and/or applications. For example, the electromagnetic circuit structure 100 may be suitable to provide signals (e.g., via the output signal traces 130) to sixty-four antenna elements, such as for beamforming.

An input signal fed to the central radiator 110, which may be from a feed line "below" the plane of FIG. 1, for example, produces electromagnetic fields within an arena 150, which is a region through which the electromagnetic energy transits. The electromagnetic energy radiates outward from the central radiator 110 and each of the receptors 120 may capture a substantially equal portion of the electromagnetic energy. Each receptor 120 is coupled to an output signal trace 130, and accordingly each output signal trace may provide an equal portion of the input signal. In various embodiments, the arena 150 may be a dielectric, and may be a substrate in which the receptors 120 and walls 140 are formed. In other embodiments the arena 150 may be a region of air, other materials, or a void or substantial vacuum.

The electromagnetic circuit structure 100 may in some instances be used as a signal combiner. Various signals provided to the output signal traces 130 (e.g., as input signals) may be radiated by the receptors 120 and captured by the central radiator 110, which may provide a combined signal to a feed line coupled to the central radiator 110.

Figure 2:
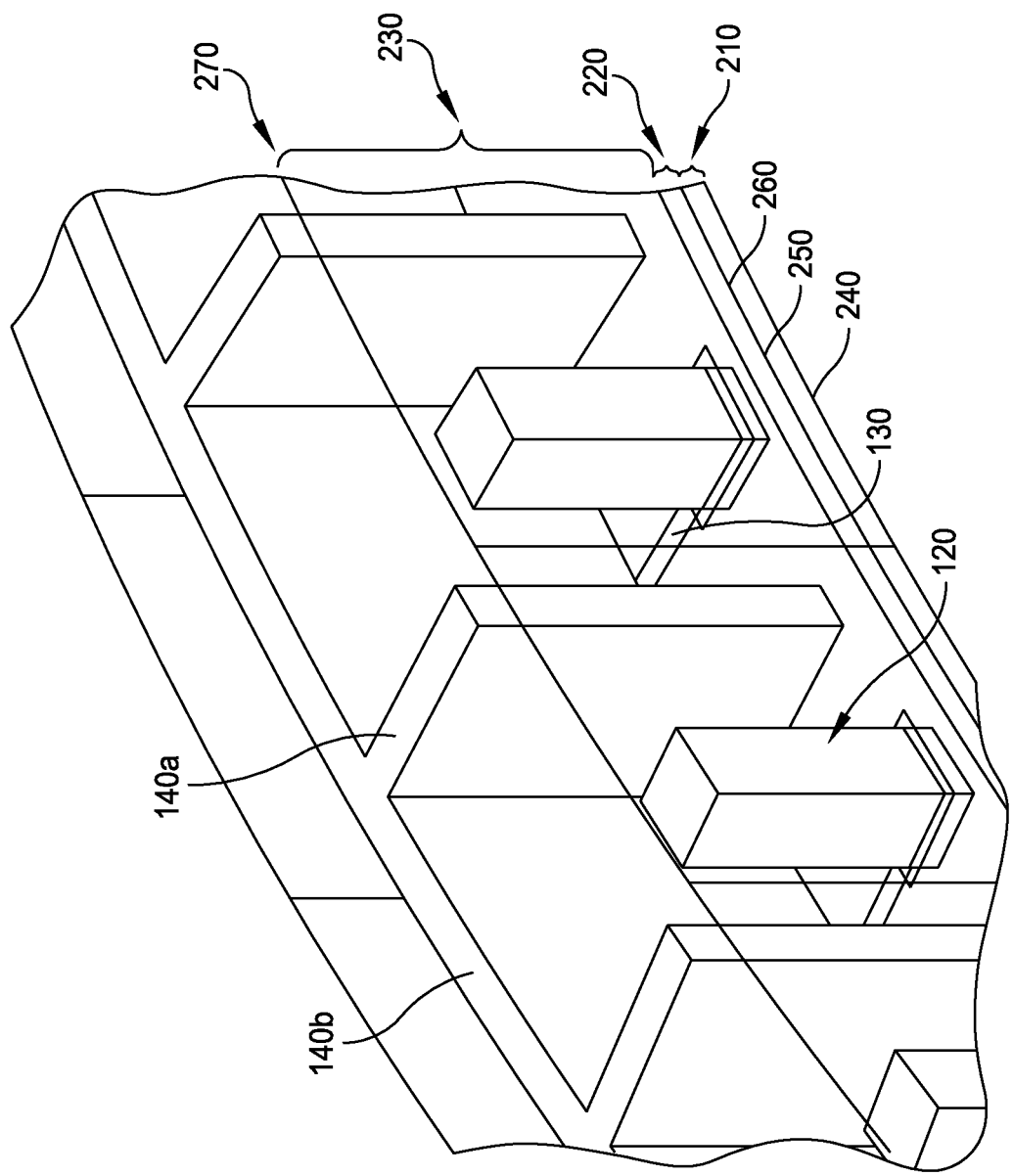
FIG. 2 is a schematic diagram of a portion of the reactive beamformer of FIG. 1.

FIG. 2 illustrates a detailed view of a portion of the electromagnetic circuit structure 100. The receptor 120 is shown as an elongate structure having a square cross-section, but in various embodiments the receptor 120 may have a cross-section of round or other shape. In some embodiments, each receptor 120 may be formed by depositing a conductive ink into a void formed by milling (e.g., a drilled hole) in a substrate. In other embodiments, each receptor 120 may be a wire, such as a copper wire or a wire of other conductive material, deposited into a hole in a substrate. Each receptor 120 may be electrically coupled to an output signal trace 130. In some embodiments, each output signal trace 130 may have a terminal pad in a position to make contact with the receptor 120. In some embodiments, the receptor 120 may include a solder bump on an end to make contact with a terminal pad of the output signal trace 130, and/or the terminal pad of the output signal trace 130 my include a solder bump to make contact with an end of the receptor 120. Each output signal trace 130 may be formed by milling an electrical conductor away from a surface of a substrate, e.g., by milling a copper electroplate from a circuit board, to form a signal trace. Accordingly, each receptor 120 and each output signal trace 130 may be formed using subtractive and additive manufacturing techniques (e.g., milling, drilling, filling) and may include solder and reflow operations to secure substantially permanent electrical connections. Accordingly, each receptor 120 and each output signal trace 130 may be formed without conventional deposition, masking, etching, bathing, and the like.

In some embodiments, the walls 140 may be formed of a conductive material, such as a conductive ink that may, in some examples, be placed by additive manufacturing techniques (e.g., 3-D printing). In some embodiments, the walls 140 may include walls 140a between receptors 120 and may include walls 140b at an outer boundary of the arena 150. In some embodiments, the walls 140a may provide electromagnetic isolation and separation between the receptors 120 and the walls 140b may provide electromagnetic isolation of the arena 150 from areas outside the arena 150. The walls 140a and 140b (collectively, walls 140) may form a substantially electrically continuous structure around the arena 150 and between adjacent ones of the receptors 120.

In various embodiments, the components described with respect to the electromagnetic circuit structure 100 may be formed on, in, or between various substrates and/or conductive layers. For example, and with continued reference to FIG. 2, the electromagnetic circuit structure 100 may be formed from and within a first substrate 210, a second substrate 220, and a third substrate 230. In some embodiments, the first substrate 210 may have a first surface 240 and a second surface 250, each of which may be substantially coated with an electrical conductor, such as electroplated copper, e.g., starting from a bare circuit board, for instance. The electrical conductor (e.g., copper) may be milled from the second surface 250 to form each of the output signal traces 130. In some embodiments, the electrical conductor (e.g., copper) on the first surface 240 may be left intact and may form a ground plane. In other embodiments, the first surface 240 may be processed in different ways and may be used for additional circuitry or components.

Various examples of manufacturing at least one of the receptors 120 are described with respect to FIGS. 3-6. Various embodiments of a reactive beamformer, e.g., the electromagnetic circuit structure 100, may be fabricated using techniques and methods in accord with those described. Replication of the same or similar techniques and methods to fabricate multiple receptors 120 may be used to fabricate a beamformer having any number of receptors 120 and accordant output signal traces 130. Further, the same or similar techniques and methods may be used to fabricate a central radiator 110, albeit without walls 140 in the vicinity of the central radiator 110. Accordingly, while examples of manufacturing a receptor 120 are described, the same or similar techniques and methods are applicable to manufacturing the whole of the electromagnetic circuit structure 100 or similar structures.

Figure 3A:
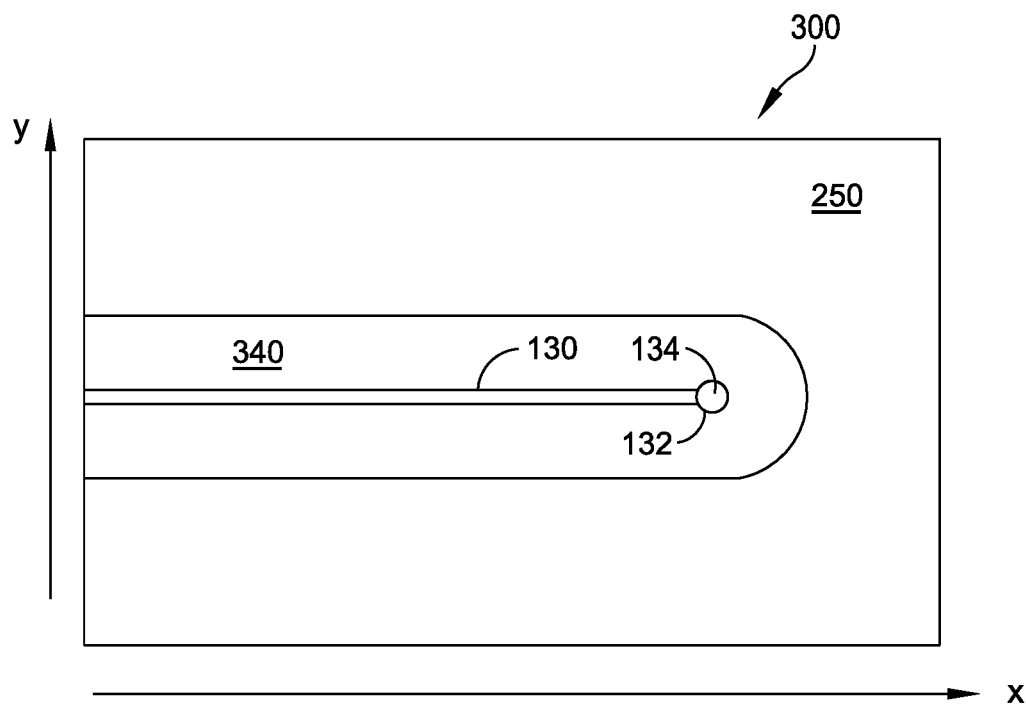
FIGS. 3A-3C are schematic top, x-axis edge and y-axis edge views of an example of a stage of manufacture of the reactive beamformer of FIG. 1.
Figure 3B:
Figure 3C:
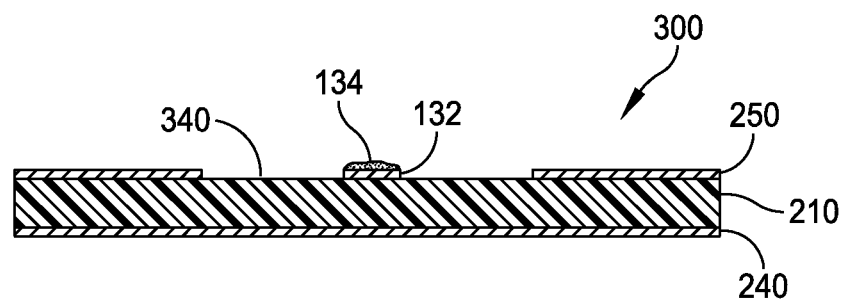

FIGS. 3A-3C show a portion structure 300 of the electromagnetic circuit structure 100 in one stage of manufacture in accord with aspects and embodiments of the systems and methods described herein. The structure 300 is the substrate 210 having a surface 240 upon which is disposed a conductive material, such as electroplated copper, for example, to form what may become a ground plane in some embodiments. The substrate 210 also has an opposing surface 250 upon which is disposed another conductive material (e.g., copper). A portion 340 of the conductive material has been milled away (e.g., subtracted) from the surface 250 to form an output signal trace 130, which is an electrically conductive feature. The removed portion 340 causes remaining conductive material to form the signal trace 130, along with a terminal pad 132 as shown. While the terminal pad 132 in this example is generally round in shape, in various embodiments the terminal pad 132 may be of a shape other than shown and may merely be a terminal end of the trace 130 with no other distinguishing shape. In various embodiments, a solder bump 134 may be placed upon the terminal pad 132 to make electrical connection with the receptor 120, as described in further detail below. In some embodiments, the output signal trace 130 may have a width as narrow as about 5 mils (0.005"), or as narrow as about 2 or 3 mils using suitable machining equipment. Accordingly, the signal trace 130 may be suitable for electromagnetic signals higher than 28 GHz, such as 35 GHz and up to 70 GHz or more. In various embodiments, signal trace widths may be even smaller to support ever greater frequencies, and may depend upon the tolerance of milling equipment used. In other embodiments, signal trace widths may be larger in support of lower frequencies, less precise milling equipment, higher current and/or signal powers, etc.

Dimensional information discussed or shown in the figures and/or an appendix is for illustrative purposes and is representative of some dimensions that may be desirable or suitable for certain applications, and may be illustrative of some dimensions achievable with the methods described herein. In various embodiments, dimensions may be significantly smaller, or may be larger, depending upon the capabilities of the milling and additive equipment used in production, and depending upon the design and application of a particular circuit.

Figure 4A:
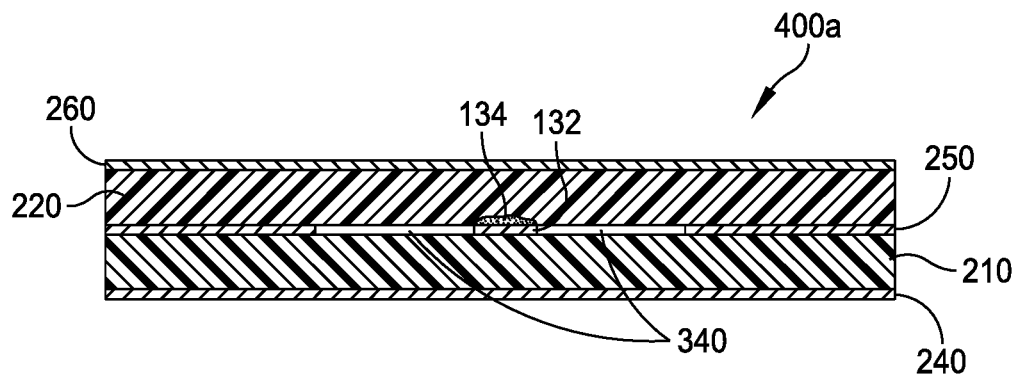
FIGS. 4A-4C are schematic diagrams of examples of further stages of manufacture of the reactive beamformer of FIG. 1.
Figure 4B:
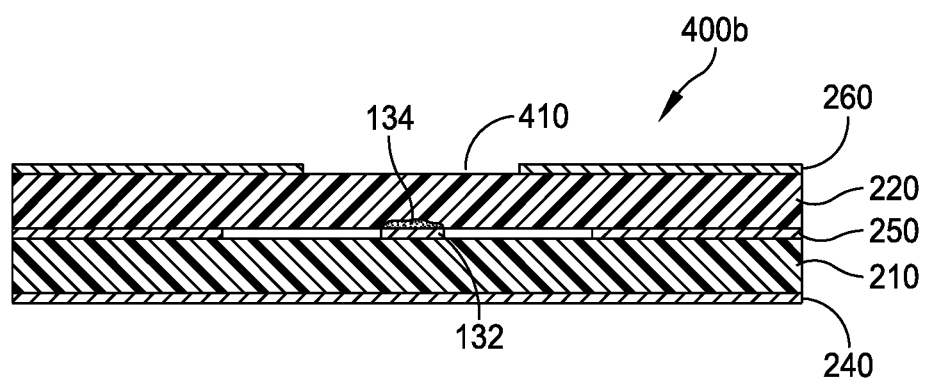
Figure 4C:
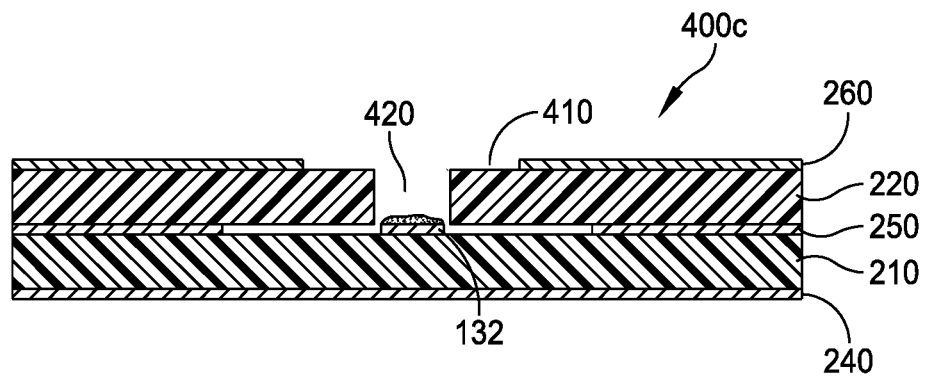

FIGS. 4A-4C illustrate portion structures 400a, 400b, 400c, that represent an example of a progression of the electromagnetic circuit structure 100 in various stages of manufacture. For example, a second substrate 220 may be bonded to the structure 300 of FIGS. 3A-3C, as shown in FIG. 4A, to substantially encapsulate the terminal pad 132 and at least part of the output signal trace 130. The second substrate 220 may have electrically conductive material on a further surface 260 (e.g., opposing a surface that is bonded to the surface 250 of the structure 300 of FIGS. 3A-3C). A portion 410 of the electrically conductive material may be milled away from the surface 260, as shown in FIG. 4B. In some embodiments, the surface 260 may not have electrically conductive material disposed thereon. A hole 420 may be drilled through the substrate 220 to provide access to the terminal pad 132 (and optional solder bump 134, see FIGS. 3A-3C), as shown in FIG. 4C. Various embodiments may involve milling, drilling, and bonding in differing orders than that described and result in the structure 400c or similar. For example, the hole 420 may be drilled prior to bonding the substrate 220 to the substrate 210. Accordingly, the order of operations may vary in various embodiments, and any suitable order may be used as a method in accord with aspects and embodiments herein, to fabricate various systems in accord with those herein.

Figure 5A:
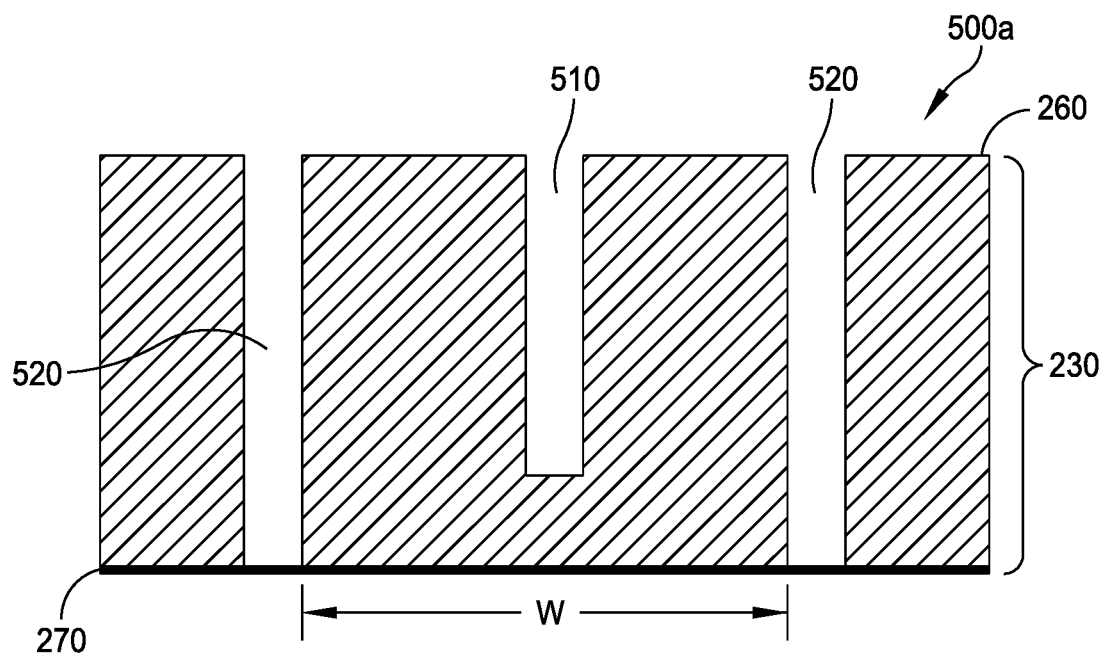
FIGS. 5A-5D are schematic diagrams of examples of further stages of manufacture of the reactive beamformer of FIG. 1.
Figure 5B:
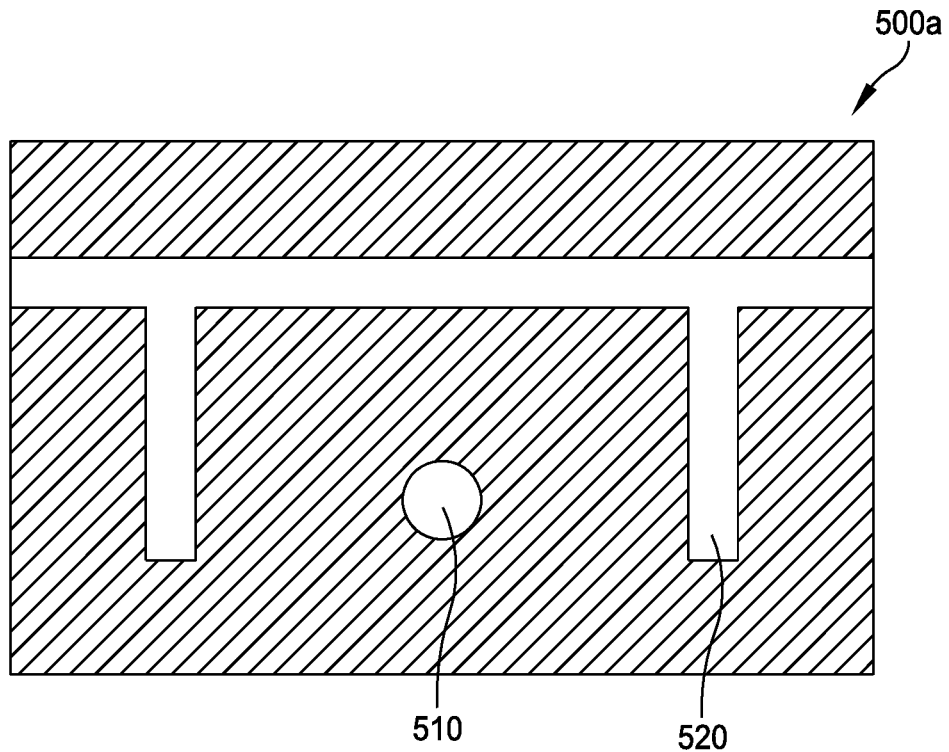

FIGS. 5A and 5B illustrate a portion structure 500a of the electromagnetic circuit structure 100 in a stage of manufacture in accord with aspects and embodiments of the systems and methods described herein. The structure 500a includes the substrate 230 (see FIGS. 3A-3C) with a hole 510 drilled into the substrate 230 and a channel 520 milled into the substrate 230. The hole 510 accommodates an electrically conductive material, such as conductive ink or a wire, to be inserted in the hole 510, to form the receptor 120. Similarly, the channel 520 accommodates electrically conductive material, which may be conductive ink, to be inserted (e.g., by additive manufacturing technique) in the channel 520, to form at least a portion of the walls 140. In some embodiments, the substrate 230 may have electrically conductive material (e.g., copper electroplate) on a surface 270, and the channel 520 may be milled through the substrate 230 down to the electrically conductive material without piercing the electrically conductive material. Accordingly, filling the channel 520 with a conductive ink may form a continuous electrical structure (e.g., the walls 140) that may be electrically coupled to a ground plane upon the surface 270.

In various embodiments, the hole 510 may be drilled such that it does not reach the surface 270. In certain embodiments, the hole 510 may be drilled about 75% of the way through the substrate 230. Some embodiments may include the hole 510 drilled about 70-80% of the way through the substrate 230, but in various embodiments the hole 510 may be drilled less of the way through the substrate 230, from 40% to 70%, or may be drilled further through the substrate 230, from 80% or more, to accommodate changing operational parameters or differing design characteristics. In various embodiments, a depth of the hole 510 may depend upon various design criteria, including a nominal or intended wavelength of electromagnetic energy to be accommodated, because the depth of the hole 510 may be interdependent with a height of the receptor 120 to be accommodated by the hole 510.

A wavelength may be the wavelength of an intended frequency of operation in the material of the substrate 230, the arena 150 (see FIG. 1), and/or materials of other of the components of the electromagnetic circuit structure 100. Further, the substrate 230 may form the material of the arena 150. The material of the substrate 230 (or any of the substrates) may include any of various materials, including glass fibers, glass fabric, ceramics, resins, epoxies, polyphenylene oxide, polyimide, cyanate ester, polytetrafluoroethylene (PTFE), or numerous others.

In certain embodiments, a width, W, between adjacent portions of the channel 520, e.g., spaced on either side of the hole 510, may be a nominal half-wavelength. As an example, a 64-element beamformer may, in some embodiments, have a total circumference exceeding thirty-two (32) wavelengths, e.g., to accommodate walls 140a (between receptors 120) that are each a half-wavelength apart. In other embodiments, the width, W, between walls 140a may be greater or lesser than a half-wavelength.

Figure 5C:
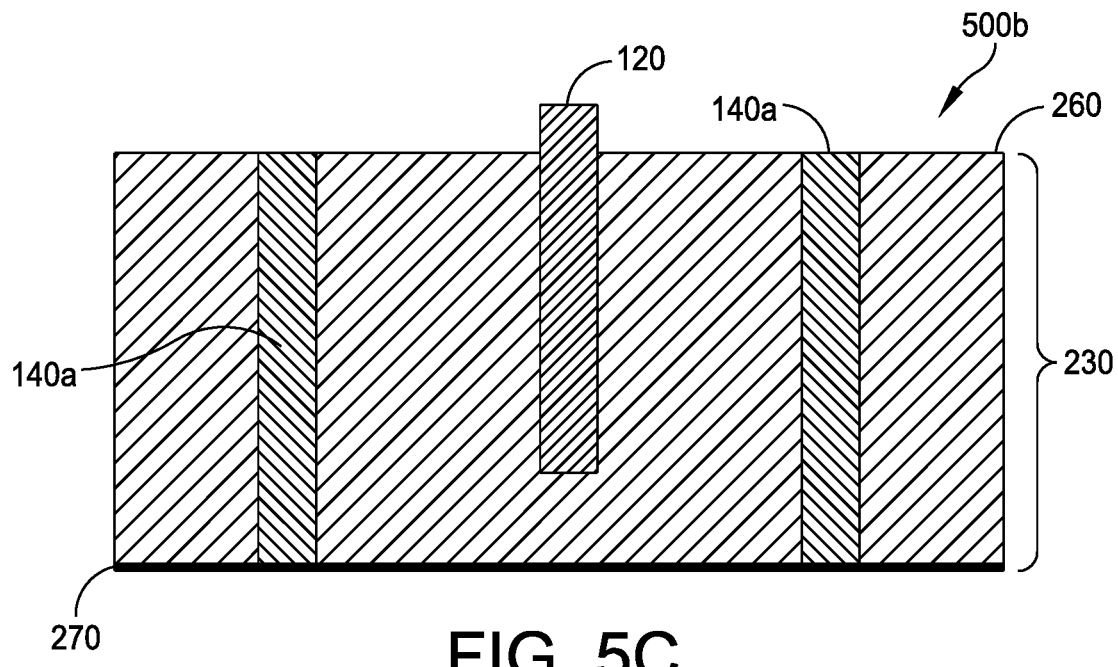
Figure 5D:
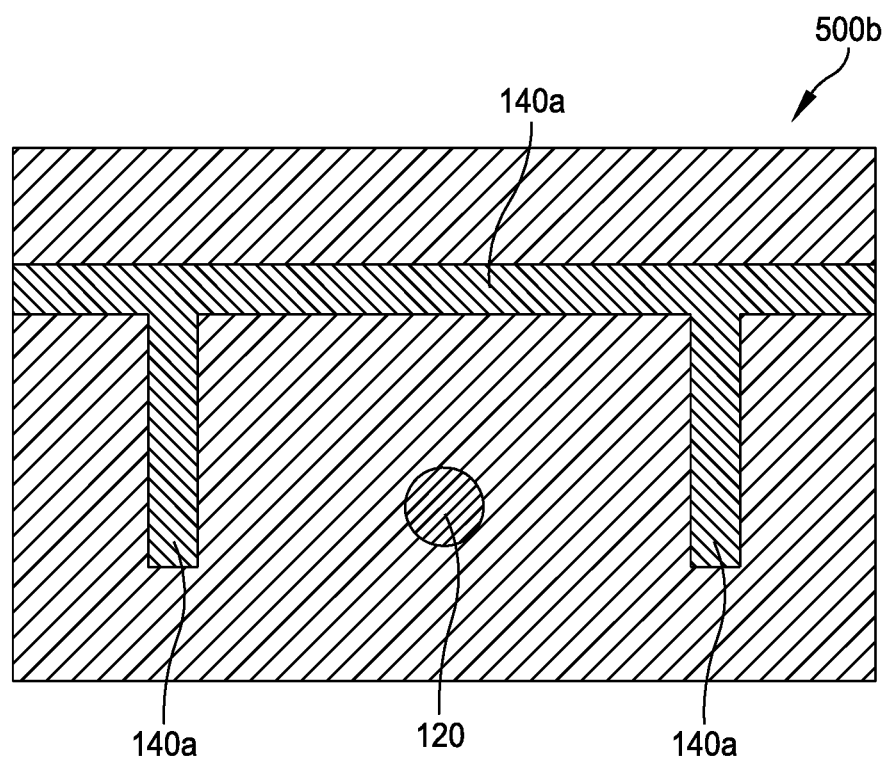

FIGS. 5C and 5D illustrate a portion structure 500b of the electromagnetic circuit structure 100 in another stage of manufacture. The portion structure 500b is similar to the portion structure 500a. The portion structure 500b includes electrically conductive material inserted in the hole 510 to form the receptor 120. In various embodiments, the electrically conductive material that forms the receptor 120 may be a wire, such as a copper or other conductor wire, which may be solid or hollow in various embodiments, or may be a conductive ink provided in the hole 510 through additive manufacturing. Similarly, the portion structure 500b includes electrically conductive material in the channel 520 to form the walls 140. In various embodiments, the electrically conductive material that forms the walls 140 may be a form of solid conductor, or may be a conductive ink provided through additive manufacturing. In some embodiments, the surface 260 may have electrically conductive material plated thereon to form a ground plane (e.g., a ground boundary), some of which may be milled away around the hole 510 (to provide an electrical clearance for the receptor 120), and the portion structure 500b may include one or more solder applications to electrically connect the walls 140 to the ground plane on the surface 260.

In certain embodiments, the receptor 120 is formed of a solid wire to accommodate an expected signal strength, and of a length to accommodate an intended frequency of operation and have a nominal impedance. In certain embodiments, the walls 140 are formed of additively applied conductive ink to enforce boundary conditions between adjacent receptors 120 to isolate the various receptors 120 from one another, and to isolate excess electromagnetic energy to inside the beamformer (e.g., in the arena 150). A majority of electromagnetic energy input to the arena 150 (e.g., via the central radiator 110) is captured by the various receptors 120 and delivered as output signals on the various output signal traces 130.

Figure 6A:
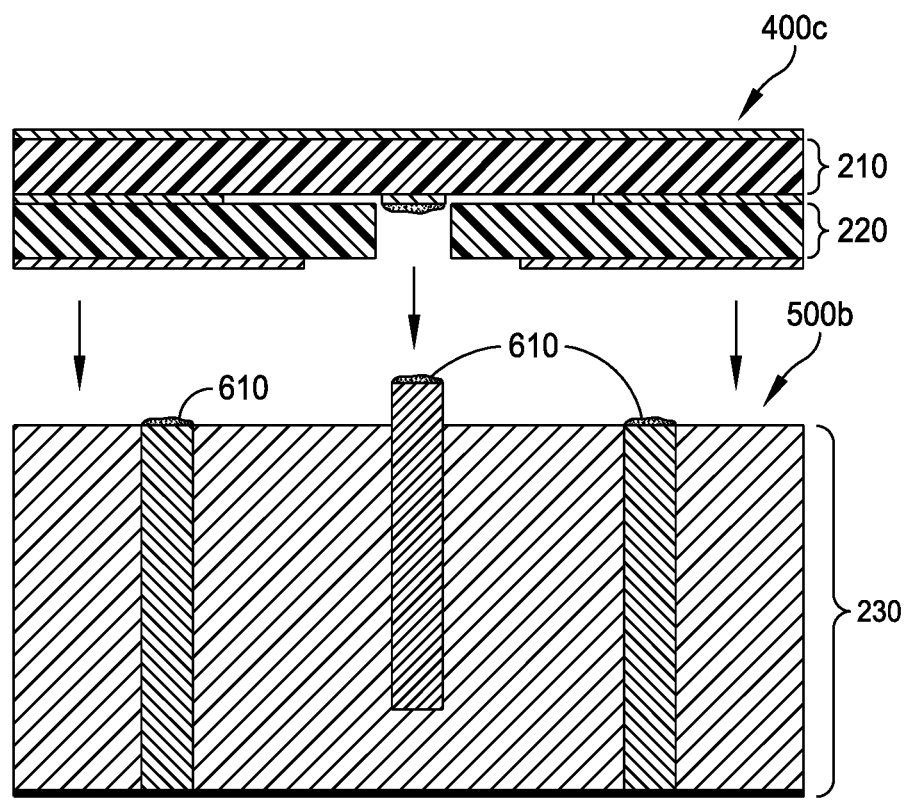
FIGS. 6A-6B are schematic diagrams of examples of further stages of manufacture of the reactive beamformer of FIG. 1.

FIG. 6A illustrates joining of the portion structure 400c (of FIG. 4C) with the portion structure 500b (of FIGS. 5C and 5D) to form a portion structure 600 that is an example of a completed receptor 120 portino of the electromagnetic circuit structure 100. In various embodiments, the portion structure 500b may include one or more solder bumps 610 added to the electrically conductive material of the walls 140 and/or the receptor 120. The portion structure 400c may be put together with the portion structure 500b, as shown, and may be bonded together by an adhesive and/or soldered together by a solder reflow process.

Figure 6B:
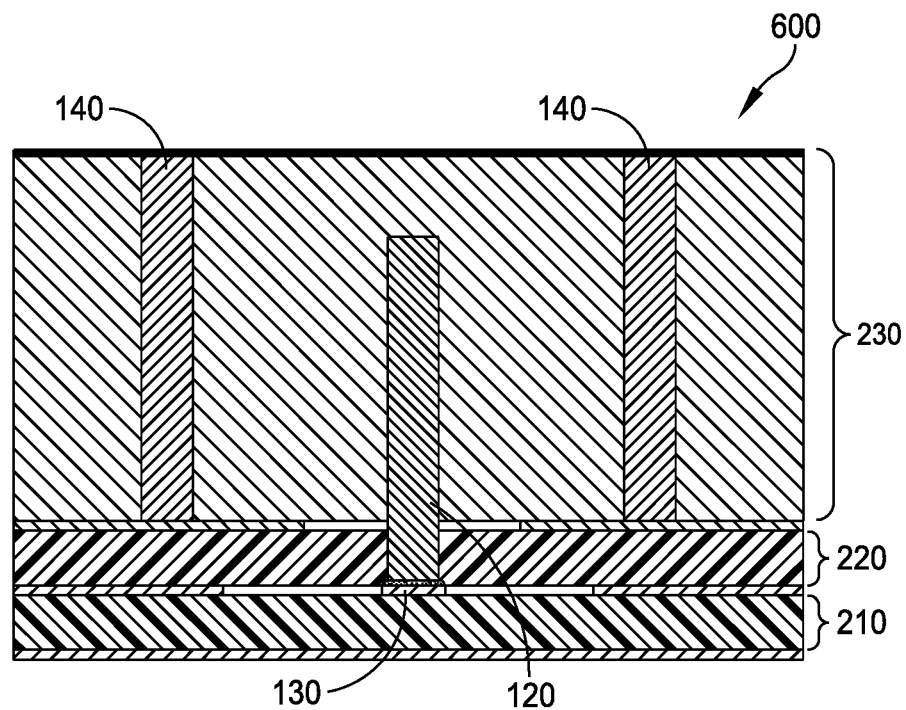

FIG. 6B illustrates an example of the completed portion of the electromagnetic circuit structure 100. The receptor 120 exists in a Faraday space surrounded by the walls 140 (e.g., the walls 140a on adjacent sides, and a wall 140b radially outward or "behind" the receptor 120) and ground planes at opposing surfaces of the substrate 230. A face of the portion structure 600, e.g., in the plane of the figure, faces into the arena 150 in a direction toward the central radiator 110. Accordingly, the Faraday space (formed by the walls 140 and ground planes) includes an open portion facing the central radiator 110. The receptor 120 is electrically isolated from the ground boundaries (walls 140 and ground planes) and is electrically connected to the output signal trace 130. Accordingly, various ones of numerous such receptors 120 may each capture a substantially equal portion of an electromagnetic signal radiating outward from the central radiator 110, and supply that portion to the output signal trace 130.

Further advantages of systems and methods described herein may be realized. For example, conventional PCB manufacturing may impose limitations on circuit feature sizes, such as the width of signal traces, in comparison with systems and method described herein, thus limiting the highest frequencies for which conventionally made electromagnetic circuits may be suitable. Further, substrate thicknesses impact characteristic impedance (e.g., due to the distance to ground planes disposed upon opposing surfaces) in relation to width of the traces. Accordingly, wider traces required by conventional PCB processes cause selection of thicker substrates (to maintain a particular characteristic impedance), thus limiting how thin the circuit can be manufactured. For example, general recommendations under conventional PCB manufacturing include total thicknesses of about 60 mil (0.060 inches). By comparison, electromagnetic circuits in accord with aspects and embodiments described, using additive manufacturing techniques, can result in circuit boards having a low profile down to a thickness of about 10 mil or less, with signal line traces having widths of about 4.4 mil, or 2.7 mil, or less, and interconnect geometries substantially flush with a surface of the board.

Ground vias conventionally provide lateral isolation of elements and electrical connectivity between ground planes (e.g., on opposing surfaces of substrates), e.g., providing some isolation of signals on the traces from other traces that may be nearby. The conventional ground vias are drilled holes of about 8 mil diameter or greater, and are required to be at least a certain distance apart (e.g., a limit to how closely spaced they may be) to maintain structural integrity of the board. Accordingly, ground vias are leaky structures, exhibiting loss of electromagnetic signal, especially at higher frequencies. As various applications require support for higher frequency signals, minimum distances between ground vias act like large openings through which relatively small wavelengths of electromagnetic energy may escape.

By comparison, electromagnetic circuits and methods in accord with aspects and embodiments described herein, using various subtractive and additive manufacturing techniques, allow for electrically continuous structures to connect ground planes. Accordingly, an electrically continuous structure is provided and disposed vertically through one or more substrates, (e.g., between opposing surfaces of the substrate) to form "Faraday walls" that confine electric fields. In various embodiments, such Faraday walls may electrically couple two or more ground planes. Further in various embodiments, such Faraday walls may confine and isolate electromagnetic fields from neighboring circuit components. In some embodiments, such Faraday walls may enforce a boundary condition to limit electromagnetic signals to be locally transverse electric-magnetic (TEM) fields, e.g., limiting signal propagation via a signal trace line to a TEM mode.

In various embodiments, various subtractive (milling, drilling), additive (printing, filling), and adherent (bonding) steps may be carried out, in various orders, with soldering and reflow operations as necessary, to form an electromagnetic circuit having one or any number of substrate layers, which may include one or more beamformers, radiators, receptors, Faraday walls, signal traces, terminal pads, or other features as described herein.

A generalized method for making any of various electromagnetic circuits includes milling a conductive material disposed on a substrate to form circuit features, printing (or depositing, e.g., via 3-D printing, additive manufacturing techniques) additional circuit features, such as resistors formed of resistive ink, for example, depositing solder on any feature, as necessary, milling (or drilling) through substrate material (and/or conductive materials) to form openings, such as voids or trenches, and depositing or printing (e.g., via 3-D printing, additive manufacturing techniques) conductive material (such as conductive ink or a wire conductor) into the voids/trenches, for example to form Faraday walls or vertical signal launches (e.g., copper). Any of these steps may be done in different orders, repeated, or omitted as necessary for a given circuit design, and to build up layers such as may include bonding steps to adhere one substrate or layer to the next, and continuing with repeated steps as necessary. Accordingly, in some embodiments, multiple substrates may be involved in the manufacture of an electromagnetic circuit, and the method includes bonding further substrates as necessary, further milling and filling operations, and further soldering and/or reflow operations.

Having described several aspects of at least one embodiment of a reactive beamformer and a method for manufacturing the same or other electromagnetic circuits, the above descriptions may be employed to produce various electromagnetic circuits having very low profiles, such as thicknesses of 10 mils (0.010 inches, 254 microns) or less, and may include signal traces as narrow as 4.4 mils (111.8 microns), 2.7 mils (68.6 microns), or even as narrow as 1.97 mils (50 microns), depending upon tolerances and accuracy of various milling and additive manufacturing equipment used. Accordingly, electromagnetic circuits in accord with those described herein may be suitable for X-Band and higher frequencies, with various embodiments capable of accommodating frequencies over 28 GHz, and up to 70 GHz or higher. Some embodiments may be suitable for frequency ranges up to 300 GHz.

Additionally, electromagnetic circuits in accord with those described herein may have a low enough profile, with accordant light weight, to be suitable for outer space applications, including folding structures to be deployed by unfolding when positioned in outer space.

Further, electromagnetic circuits manufactured in accord with methods described herein accommodate less expensive and faster prototyping, without the necessity for caustic chemicals, masking, etching, bathing, electroplating, etc. Simple substrates with pre-plated conductive material disposed on one or both surfaces (sides) may form the core starting material(s), and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accord with methods described herein may accommodate deployment on, or designs calling for, non-planar surfaces. Thin, low-profile electromagnetic circuits, such as described herein and others, may be manufactured using mill, fill, and bond techniques as described herein to produce electromagnetic circuits having various contours to accommodate changing applications, to conform to a surface (such as a vehicle) or to support complex array structures, for example.

An appendix that includes various additional details and aspects is filed concurrently herewith and is hereby incorporated in and part of this specification.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A reactive beamformer, comprising:
a central radiator disposed within a substrate and configured to radiate a received electromagnetic signal;
a plurality of receptors disposed within the substrate around the central radiator, each of the plurality of receptors configured to receive a portion of the radiated electromagnetic signal that radiates outward from the central radiator within an arena;
a plurality of signal lines, each signal line of the plurality of signal lines being coupled to a respective receptor of the plurality of receptors to convey the portion of the radiated electromagnetic signal from the respective receptor and to provide the portion of the radiated electromagnetic signal to an output; and
a plurality of electrically conductive isolation walls disposed within the substrate and configured to isolate each receptor of the plurality of receptors from adjacent receptors of the plurality of receptors, the plurality of electrically conductive isolation walls defining an outer boundary of the arena,
wherein the plurality of electrically conductive isolation walls includes an outer wall forming a continuous structure around the arena and inwardly extending walls positioned between each receptor to provide electromagnetic isolation and separation between the plurality of receptors and electromagnetic isolation of the arena from areas outside the arena.

2. The reactive beamformer of claim 1, wherein each receptor of the plurality of receptors is formed of an electrically conducting wire deposited into a milled hole in the substrate.

3. The reactive beamformer of claim 2, wherein the central radiator is formed of an electrically conducting wire deposited into a milled hole in the substrate.

4. The reactive beamformer of claim 2, wherein each signal line of the plurality of signal lines is coupled to one receptor of the plurality of receptors by a solder joint formed at least in part by a solder reflow process.

5. The reactive beamformer of claim 1, wherein the plurality of receptors is physically arranged circumferentially around the central radiator, each receptor of the plurality of receptors being substantially equidistant from the central radiator and substantially equally spaced from each other.

6. The beamformer of claim 1, wherein the outer wall is configured to contain the radiated electromagnetic signal to a region within the outer wall, the central radiator and the plurality of receptors being disposed within the region.

7. The reactive beamformer of claim 1, wherein the outer wall and each inwardly extending wall of the plurality of electrically conductive isolation walls is formed of a conductive ink deposited into a trench in the substrate.

8. The reactive beamformer of claim 1, wherein the outer wall is electrically coupled to each inwardly extending wall of the plurality of electrically conductive isolation walls.

9. The reactive beamformer of claim 8, further comprising a ground plane adjacent at least one surface of the substrate, the outer wall and the inwardly extending walls being in electrically conductive communication with the ground plane.

10. The reactive beamformer of claim 1, wherein the substrate is a first substrate and the plurality of signal lines is adjacent to a surface of a second substrate, the second substrate being bonded to the first substrate.

11. The reactive beamformer of claim 10, wherein the second substrate is indirectly bonded to the first substrate by one or more intermediate layers between the second substrate and the first substrate.

12. The reactive beamformer of claim 1, wherein the reactive beamformer is configured to operate in millimeter-wave frequencies between 26.5 to 110 GHz.

13. A method of manufacturing the reactive beamformer of claim 1, the method comprising:
    milling a first substrate to form a first opening to accommodate a first electrical conductor;
    milling the first substrate to form a plurality of second openings to accommodate a plurality of second electrical conductors;
    milling the first substrate to form a continuous trench to accommodate a third electrical conductor;
    depositing a first wire as the first electrical conductor in the first opening, the first wire forming an electromagnetic radiator;
    depositing a plurality of second wires as the plurality of second electrical conductors in the plurality of second openings, each second wire of the plurality of second wires forming an electromagnetic receptor; and
    filling the continuous trench with a conductive ink, the conductive ink forming a the plurality of electrically conductive isolation walls.

14. The method of claim 13, further comprising milling a conductive material disposed upon a second substrate to form a plurality of signal traces, each signal trace of the plurality of signal traces having a terminal end configured to have physical and electrical alignment with a respective one of the first electrical conductor or one of the plurality of second electrical conductors when the second substrate is aligned adjacent to the first substrate.

15. The method of claim 14, further comprising bonding the second substrate to the first substrate, directly or indirectly, the second substrate being positioned so each terminal end of the plurality of terminal ends make physical and electrical contact with one of the first electrical conductor or one of the plurality of second electrical conductors.

16. The method of claim 15, further comprising reflowing solder to bond each terminal end of the plurality of terminal ends with the respective one of the first electrical conductor or one of the plurality of second electrical conductors.

17. The method of claim 15, further comprising bonding a third substrate to the second substrate to substantially encapsulate the plurality of signal traces and terminal ends between the second substrate and the third substrate.

18. The method of claim 17, further comprising drilling through at least one of the second substrate and the third substrate to provide a plurality of access holes, each access hole of the plurality of access holes providing access to one of the plurality of terminal ends.

* * * * *